(12) United States Patent
Magee et al.

(10) Patent No.: US 12,345,768 B2
(45) Date of Patent: Jul. 1, 2025

(54) TEMPERATURE ESTIMATION USING ELECTROCHEMICAL IMPEDANCE SPECTROSCOPY

(71) Applicant: TEXAS INSTRUMENTS INCORPORATED, Dallas, TX (US)

(72) Inventors: David Magee, Allen, TX (US); Kartik Sastry, Atlanta, GA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/732,012

(22) Filed: Apr. 28, 2022

(65) Prior Publication Data

US 2023/0349979 A1    Nov. 2, 2023

(51) Int. Cl.
*G01R 31/3842*    (2019.01)
*G01R 31/367*    (2019.01)
*H01M 10/48*    (2006.01)

(52) U.S. Cl.
CPC ....... *G01R 31/3842* (2019.01); *G01R 31/367* (2019.01); *H01M 10/486* (2013.01)

(58) Field of Classification Search
CPC ............. G01R 31/3842; G01R 31/367; H01M 10/486
See application file for complete search history.

(56) References Cited

U.S. PATENT DOCUMENTS

| | | | | |
|---|---|---|---|---|
| 6,160,382 A * | 12/2000 | Yoon | ..... | G01R 31/367 702/65 |
| 2012/0150464 A1* | 6/2012 | Swanton | ..... | G01R 31/392 702/63 |
| 2013/0307487 A1* | 11/2013 | Matthe | ..... | H02J 7/00 320/152 |
| 2016/0103184 A1* | 4/2016 | Kawai | ..... | G01R 31/389 702/63 |
| 2017/0331162 A1* | 11/2017 | Clarke | ..... | H01M 10/4285 |
| 2018/0196107 A1* | 7/2018 | Fleischer | ..... | G01R 31/367 |
| 2021/0123815 A1* | 4/2021 | Boss | ..... | G01R 31/389 |
| 2021/0367442 A1* | 11/2021 | Konopka | ..... | H02J 7/00712 |
| 2023/0003805 A1* | 1/2023 | Kroener | ..... | G01R 31/374 |

FOREIGN PATENT DOCUMENTS

DE    102019218591 A1 *    6/2021    ........... G01R 31/367

OTHER PUBLICATIONS

Jim Stiles "Impedance and Admittance", The University of Kansas (Year: 2009).*
Impedance/admittance (Year: 2009).*

* cited by examiner

*Primary Examiner* — Catherine T. Rastovski
*Assistant Examiner* — Sharad Timilsina
(74) *Attorney, Agent, or Firm* — Charles F. Koch; Frank D. Cimino

(57) ABSTRACT

A temperature estimation apparatus includes a measurement circuit and a temperature estimation circuit. The measurement circuit is configured to acquire a voltage measurement and a current measurement. The voltage measurement and the current measurement include a frequency component. The temperature estimation circuit is coupled to the measurement circuit. The temperature estimation circuit is configured to estimate an impedance based on the voltage measurement and the current measurement, and estimate a temperature based on a feature vector including at least two features of the impedance.

18 Claims, 4 Drawing Sheets

TEMPERATURE ESTIMATION USING ELECTROCHEMICAL IMPEDANCE SPECTROSCOPY

BACKGROUND

Batteries are used to power a wide variety of electronic devices. Lithium ion is one commonly used battery technology. As the energy density of batteries has increased, applications using batteries as a power source have also increased. For example, high energy density batteries enable electric and hybrid electric vehicles. In many applications, the temperature of battery cells should be monitored to ensure that the battery cells are operating in a specified temperature range, to monitor the health of the battery cells, and to reduce battery cell failures that can damage the battery cell or the device powered by the battery cell.

SUMMARY

In one example, a temperature estimation apparatus includes a measurement circuit and a temperature estimation circuit. The measurement circuit is configured to acquire a voltage measurement and a current measurement. The voltage measurement and the current measurement include a frequency component. The temperature estimation circuit is coupled to the measurement circuit. The temperature estimation circuit is configured to estimate an impedance based on the frequency component, and estimate a temperature based on a feature vector including at least two features of the impedance.

In another example, a method includes measuring a voltage and a current of a device. The voltage and the current include a frequency component. An impedance of the device is estimated based on the frequency component. A temperature of the device is estimated based on a feature vector including at least two features of the impedance.

In a further example, an electric vehicle battery system includes a battery cell, a measurement circuit, and a temperature estimation circuit. The measurement circuit is coupled to the battery cell, and is configured to measure and a current and voltage of the battery cell. The current and the voltage include a frequency component. The temperature estimation circuit is coupled to the measurement circuit. The temperature estimation circuit is configured to estimate an impedance of the battery cell based on the frequency component, and to estimate a temperature of the battery cell based on a feature vector including at least two features of the impedance.

DETAILED DESCRIPTION

To protect a device powered by batteries, and the batteries themselves, a battery cell monitoring system capable of accurate core cell temperature estimation at a rate sufficient to allow the monitoring system to disable the cell should the cell temperature exceed a predetermined threshold is desired. One implementation of a battery monitoring system measures battery cell temperature using a thermistor attached to the casing of a battery cell. However, the cost and weight of such implementations increases with the number of battery cells, due to the added thermistors and wiring. Moreover, heat must be transferred to the battery cell's casing before the thermistor can detect a change in temperature, so the cell's core temperature may be higher than the casing temperature. The difference in cell core and casing temperature can exceed 20° Celsius (C) in some battery cells.

The temperature estimation apparatus and methods described herein use of Electro-chemical Impedance Spectroscopy (EIS) to measure battery cell temperature. EIS-based cell temperature estimation uses current and voltage measurements at the cell's terminals to determine cell temperature, and do not require additional wiring or temperature sensors. EIS-based temperature estimation, in accordance with the methodology described herein, produces temperature estimates with less than 1° C. of error over a wide measurement frequency range (e.g., 1 millihertz to 10 kilohertz and a wide operating temperature range (e.g., −30° C. to 55° C.).

Figure 1:
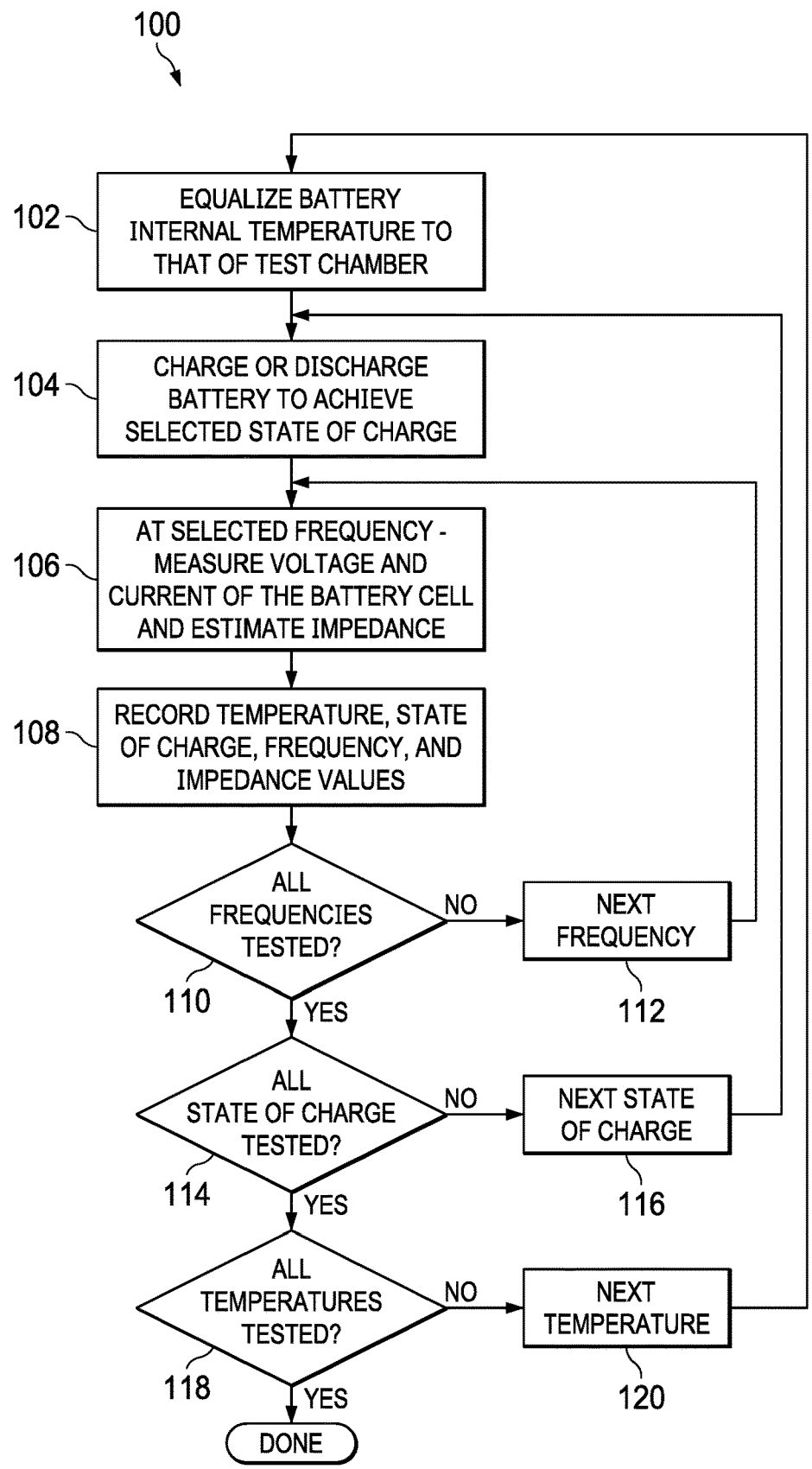
FIG. 1 is a flow diagram for a method of battery cell characterization for use in Electro-chemical Impedance Spectroscopy (EIS) based temperature estimation.

FIG. 1 is a flow diagram for a method 100 of battery cell characterization for use in EIS-based temperature estimation. Though depicted sequentially as a matter of convenience, at least some of the actions shown can be performed in a different order and/or performed in parallel. Additionally, some implementations may perform only some of the actions shown.

In block 102, the battery cell being characterized is in a temperature-controlled environment, such as a temperature chamber. The internal temperature ($T_n$, where $\{T_n\}_{n=1}^{N}$) of the temperature chamber is set to a desired temperature, and the battery cell is placed into the temperature chamber and is heated up until the internal temperature of the battery cell is the same as the internal temperature of the temperature chamber.

In block 104, the battery cell is brought to a selected state of charge (SoC), $SoC_j$, where $\{SoC_j\}_{j=1}^{J}$, by charging or discharging the battery cell as needed.

In block 106, the voltage across the battery cell, or the current flowing from the battery cell, is modulated at a selected frequency ($f_m$, where $\{f_m\}_{m=1}^{M}$). For example, a load driven by the battery cell is changed at the selected frequency to modulate the current. The voltage and current at the battery cell are measured, and the impedance of the battery cell is estimated based on the measured voltage and current for a given modulation frequency.

In block 108, the temperature of the battery cell, the state of charge of the battery cell, the frequency, and the impedance of the battery cell are recorded (e.g., in a database).

If, in block 110, the battery cell has not been tested at all desired frequencies (with the current temperature and state of charge), then the voltage or current modulation frequency is changed to a next desired frequency in block 112, and characterization continues in block 106.

If, in block 110, the battery cell has been tested at all desired frequencies (with the current temperature and state of charge), then the method 100 determines whether the battery cell has been tested at all desired states of charge (at the current temperature) in block 114. If all desired states of charge of the battery cell have not been tested (with the current temperature) in block 114, then a new state of charge is selected in block 116, and characterization continues in block 104.

If, in block 114, the battery cell has been tested at all desired states of charge (with the current temperature), then the method 100 determines whether the battery cell has been tested at all desired temperatures in block 118. If the battery cell has not been characterized at all desired temperatures in block 118, then a new temperature is selected in block 120, the temperature is set to the new temperature, and characterization continues in block 102.

If, in block 118, the battery cell has been characterized at all desired temperatures, then a total of J×N×M impedance values will have been recorded, with N×M impedance values associated with each of $\{SoC_j\}_{j=1}^{J}$. To enable online temperature estimation at a reasonable rate (i.e. 10 to 20 temperature estimates per second), it is desirable to measure the battery cell impedance at a single frequency, $f_m$, that is 10 to 100× higher than the estimation rate. Therefore, a temperature estimator must first learn the relationship between the set of N impedance measurements available at a particular frequency, and the corresponding set of N temperatures at which the measurements were taken.

Some EIS-based temperature estimation methods map the battery cell impedance, a complex-valued quantity, to a single, real-valued impedance feature. However, information can be lost in this transformation process. Four common choices for the real-valued impedance feature are the real part of impedance (Re{Z}), the imaginary part of impedance (Im{Z}) the magnitude of impedance (|Z|) and the phase angle of impedance (∠Z). Curve fitting is applied to approximate the functional relationship between the chosen real-valued impedance feature and battery cell temperature. E.g., $T_n \approx a_3 x^3 + a_2 x^2 + a_1 x + a_0$. The equation of the curve is applied to estimate temperature in real-time based on impedance measurements (a selected feature of the impedance measurements). However, EIS-based temperature estimation using a single feature of measured impedance provides accurate temperature estimation (within 1° C. of the correct temperature) over only a narrow band of frequencies. One feature of impedance is insufficient to characterize the relationship of impedance to temperature over a reasonable range of frequencies.

To provide improved temperature estimation, the EIS-based temperature estimation disclosed herein, relates multiple (K), features of impedance to temperature. Equation (1) below is an example of feature vector that includes nine terms based on multiple features of impedance. Inverse terms (e.g., $\text{Re}\{Z_n\}^{-1}$, $\text{Re}\{Z_n\}^{-2}$, $|Z_n|^{-1}$, $|Z_n|^{-2}$) may be included in the feature vector to improve accuracy.

$$x_n^T = [\text{Re}\{Z_n\}^{-1} \text{Re}\{Z_n\}^{-2} - \text{Im}\{Z_n\}(-\text{Im}\{Z_n\})^2 \\ |Z_n|^{-1} |Z_n|^{-2} \angle Z_n (\angle Z_n)^2 1] \quad (1)$$

Equation (2) is solved to produce a vector of weights (w*) applied to the feature vector to estimate temperature in equation (3):

$$w^* = \underset{w}{\text{argminmax}} |T_n - x_n^T w| \quad (2)$$

$$\hat{T}_n = x_n^T w^* \quad (3)$$

Figure 2:
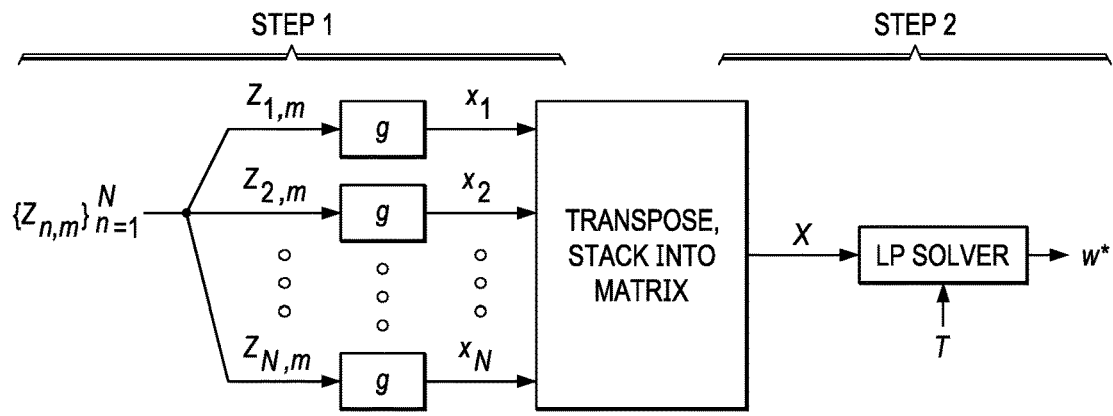
FIG. 2 is a flow diagram for a method of offline data processing for EIS-based temperature estimation as described herein.

FIG. 2 is a flow diagram for a method 200 of offline data processing for EIS-based temperature estimation. For each SoC, the temperature and impedance data collected, as described with reference to the method 100, can be represented as:

$$T = [T_1 \ T_2 \ \ldots \ T_N]^T \in \mathbb{R}^N, \text{ and} \quad (4)$$

$$Z = \begin{bmatrix} Z_{1,1} & \ldots & Z_{1,M} \\ \vdots & \ddots & \vdots \\ Z_{N,1} & \ldots & Z_{N,M} \end{bmatrix} \in \mathbb{C}^{N \times M}. \quad (5)$$

The $m^{th}$ column of Z contains N measurements of the battery cell impedance at a particular frequency $f_m$—one measurement at each temperature $\{T_n\}_{n=1}^{N}$. The $n^{th}$ row of Z contains M measurements of the cell impedance at a particular temperature $T_n$—one measurement at each frequency $\{f_m\}_{m=1}^{M}$.

In step 1 of the method 200, for each temperature $T_n$, n=1, . . . , N, the battery impedance (denoted $Z_{n,m}$) at frequency $f_m$ and temperature is mapped to a vector of K real-valued impedance features, $x_n \in \mathbb{R}^K$, according to:

$$x_n = g(Z_{n,m}) \text{ for } n=1, \ldots N \quad (6)$$

Figure 4:
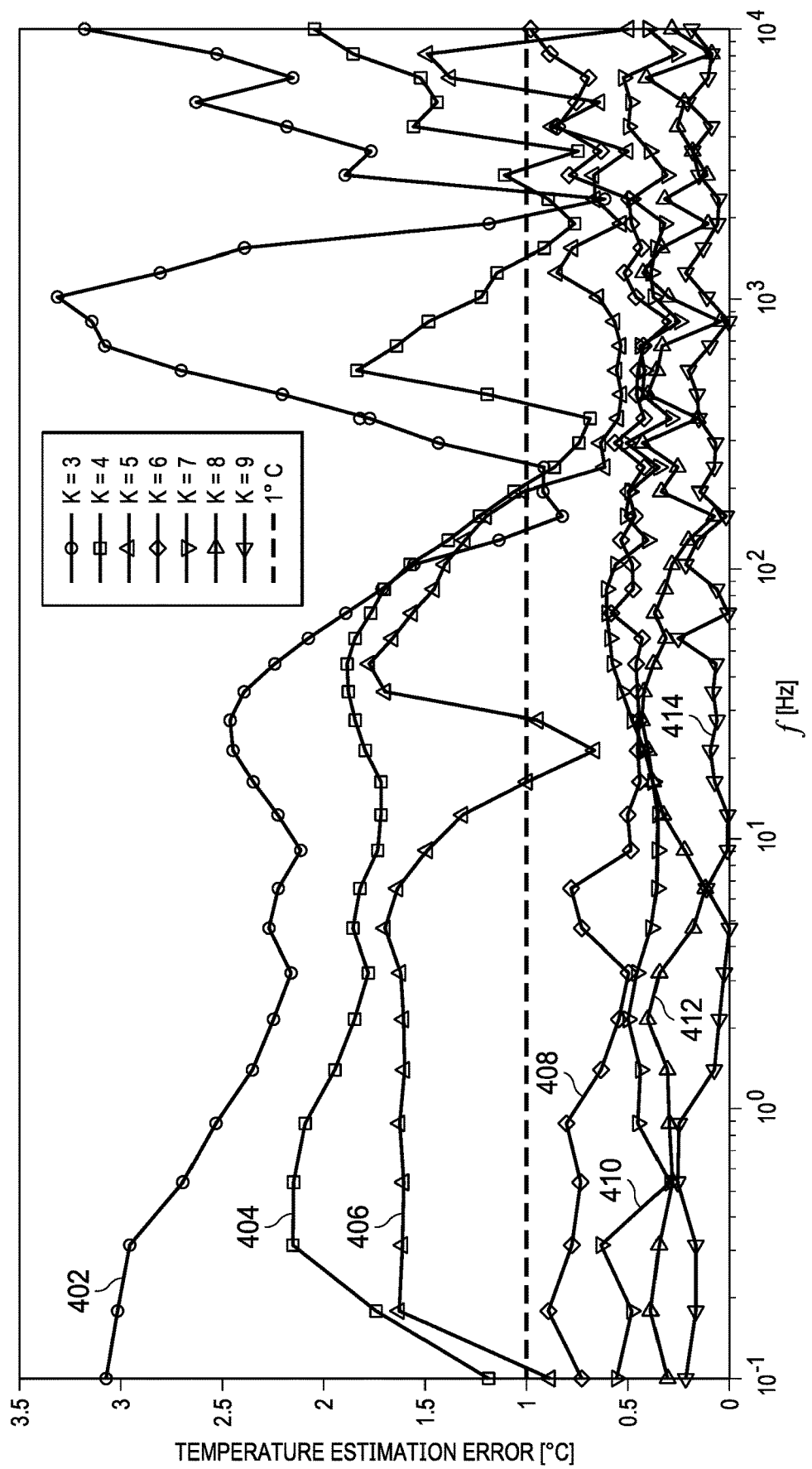
FIG. 4 is a graph illustrating temperature estimation error over frequency using different feature vector sizes to estimate temperature.

The transformation rule g: $\mathbb{C} \to \mathbb{R}^K$ for mapping from the complex variable domain $\mathbb{C}$ to the real variable domain $\mathbb{R}$ of order K, which can be determined by the desired level of temperature estimation error (see, e.g., FIG. 4 showing example error for different values of K).

In step 2 of the method 200, the $\{x_n\}_{n=1}^{N}$ are transposed and stacked to form the matrix:

$$X = \begin{bmatrix} - & x_1^T & - \\ & \vdots & \\ - & x_N^T & - \end{bmatrix} \in \mathbb{R}^{N \times K}. \quad (7)$$

Each row of X corresponds to one of the N temperatures at which cell impedance is measured. Each column of X corresponds to one of the K real-valued impedance features defined in Step 1. To determine the 'best' linear combination of the K real-valued impedance features for temperature estimation, the convex optimization problem of equation (8) is solved for a vector of optimal weights, $w^* \in \mathbb{R}^K$. Note that the maximum absolute temperature estimation error (over the temperature range of interest) is minimized. Note also that $x_n$ can contain multiple transformations of the same real-valued impedance feature (e.g. both $\angle Z_{n,m}$ and $(\angle Z_{n,m})^2$), in which case the resulting temperature estimate can be interpreted as a non-linear combination of impedance features.

$$w^* = \underset{w}{\text{argmin}} \|T - Xw\|_\infty = \underset{w}{\text{argminmax}} |T_n - x_n^T w| \quad (8)$$

Equation (8) can be re-cast as the equivalent linear program:

$$\underset{y}{\text{minimize}} \; c^T y \text{ subject to } Ay \leq b \tag{9}$$

with decision variables y and constant data matrices A, b, c defined as follows:

$$c = \begin{bmatrix} 0_{K \times 1} \\ 1 \end{bmatrix} \tag{10}$$

$$y = \begin{bmatrix} w \\ v \end{bmatrix} \tag{11}$$

$$A = \begin{bmatrix} -X & -1_{N \times 1} \\ X & -1_{N \times 1} \end{bmatrix} \tag{12}$$

$$b = \begin{bmatrix} -T \\ T \end{bmatrix} \tag{13}$$

Linear programming solvers are a mature technology and can be leveraged to solve Equation (9) in lieu of solving Equation (8) directly. Depending on the design of g, Equation (8) may not be amenable to a direct numerical solution. If the entries of X take values spanning several orders of magnitude, the constraint matrix A in Equation (12) can become poorly conditioned, and a linear programming solver can produce a "solution" with poor constraint satisfaction. To remedy this issue, each column of X may be re-scaled to form $\tilde{X} = X\beta^{-1}$, where the scaling matrix $\beta = \text{diag}(\beta_1, \beta_2, \ldots, \beta_K) \in \mathbb{R}^{K \times K}$, and $\beta_k > 0$ is the "typical magnitude" of the values in the $k^{th}$ column of X. Equation (9) may then be solved with $\tilde{X}$ in place of X, and with the understanding that the resulting set of optimal weights will also be scaled.

Figure 3:
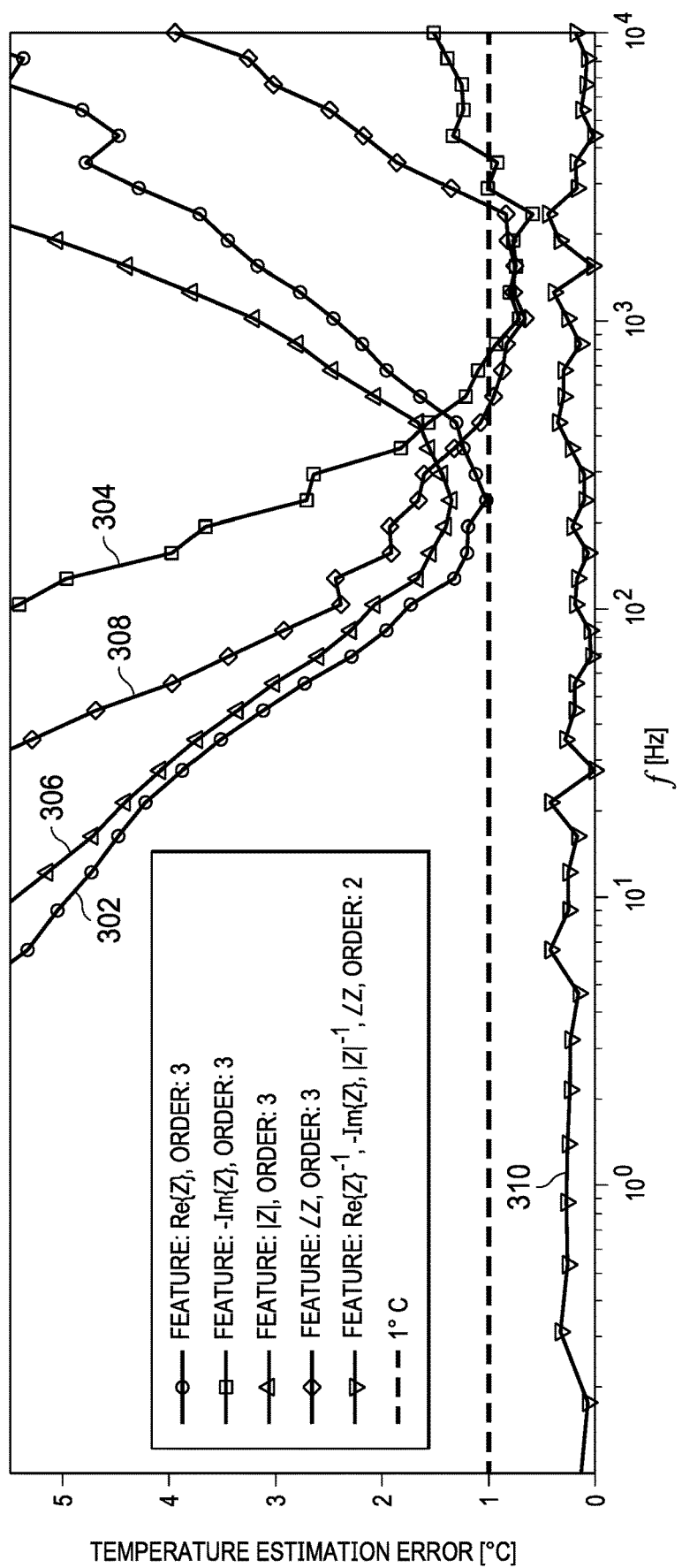
FIG. 3 is a graph showing temperature estimation error for temperature estimates based on a single impedance feature and temperature estimates based on multiple impedance features as described herein.

FIG. 3 shows error of temperature estimation based on a single impedance feature and error of temperature estimation based on multiple impedance features as described herein. The curve 302 represents the error in temperature versus frequency for temperature estimated based on a third order fit of Re{Z}. The curve 304 represents the error in temperature over frequency for temperature estimated based on a third order fit of −Im{Z}. The curve 306 represents the error in temperature over frequency for temperature estimated based on a third order fit of |Z|. The curve 308 represents the error in temperature over frequency for temperature estimated based on a third order fit of ∠Z. The curve 310 represents the error in temperature over frequency for temperature estimated based on a second order fit of Re{Z}, −Im{Z}, |Z|⁻¹, and ∠Z. FIG. 3 shows that using multiple impedance features, the temperature estimation error is less than 1% across a wide range of frequencies, while the temperature estimation error using a single impedance feature is less than 1% over a narrow range of frequencies for −Im{Z} and ∠Z, and does not fall below 1% for Re{Z}, and |Z| at any frequency.

FIG. 4 illustrates temperature estimation error over frequency using different feature vector sizes to estimate temperature. The curve 402 uses a 3 term feature vector. The curve 404 uses a four term feature vector. The curve 406 uses a five term feature vector. The curve 408 uses a six term feature vector. The curve 410 uses a seven term feature vector. The curve 412 uses an eight term feature vector. The curve 414 uses a nine term feature vector. The six, seven, eight, and nine term feature vectors provide temperature estimates with less than 1% error over all illustrated frequencies. Thus, the length of the feature vector can be selected to balance computational complexity and estimation accuracy while maintaining less than 1% error.

Figure 5:
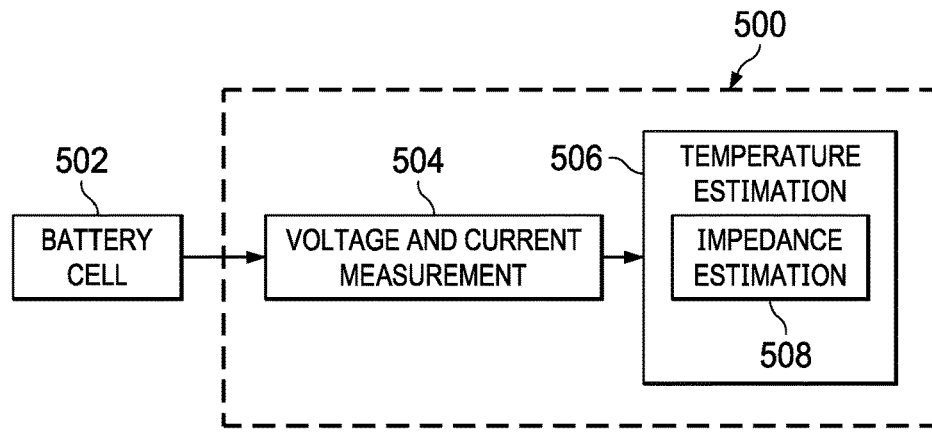
FIG. 5 is a block diagram for a temperature estimation system that uses multiple impedance features to estimate temperature.

FIG. 5 shows a block diagram for temperature estimation system 500 that uses multiple impedance features to estimate temperature. The temperature estimation system 500 is coupled to a battery cell 502. The battery cell 502 may be a battery cell of an electric vehicle, a hybrid vehicle, or any other battery powered device or system. The battery cell 502 may include one or more battery cells connected in parallel and/or in series. The temperature estimation system 500 includes a voltage and current measurement circuit 504, and a temperature estimation circuit 506. The voltage and current measurement circuit 504 includes voltage measurement circuitry to measure the voltage across the battery cell 502, and current measurement circuitry to measure the current flowing to or from the battery cell 502. The temperature estimation system 500 includes digitization circuitry to convert voltage and current measurements to digital values. The voltage and current measurement circuit 504 provides the measured values of voltage and current to the temperature estimation circuit 506. The flow of current from the battery cell 502 and/or the voltage across the battery cell 502 may be modulated at a frequency set by a load coupled to the battery cell 502. For example, the temperature estimation circuit 506 may set one or more frequency of voltage and/or current modulation by controlling a load (e.g., a switching a load transistor, setting fan or pump speed, etc.) coupled to the battery cell 502.

The temperature estimation circuit 506 includes an impedance estimation circuit 508. The impedance estimation circuit 508 computes the impedance of the battery cell 502, and the features of the impedance based on the voltage and current measurements received from the voltage and current measurement circuit 504, and the frequency at which the voltage and/or current are modulated. For example, the impedance estimation circuit 508 may compute a Fourier transform of the voltage and current measurements at the one or more frequencies applied to measure voltage and current of the battery cell 502 to generate complex voltage and current values V[k] and I[k] (k is a frequency index). Complex impedance Z[k] is computed as $$Z[k] = \frac{V[k]}{I[k]}.$$

The temperature estimation circuit 506 computes a temperature estimate (an estimated temperature value) based on multiple impedance features (arranged as a feature vector) provided by the impedance estimation circuit 508. The temperature estimation circuit 506 may estimate the temperature of the battery cell 502 in accordance with equation (3).

Figure 6:
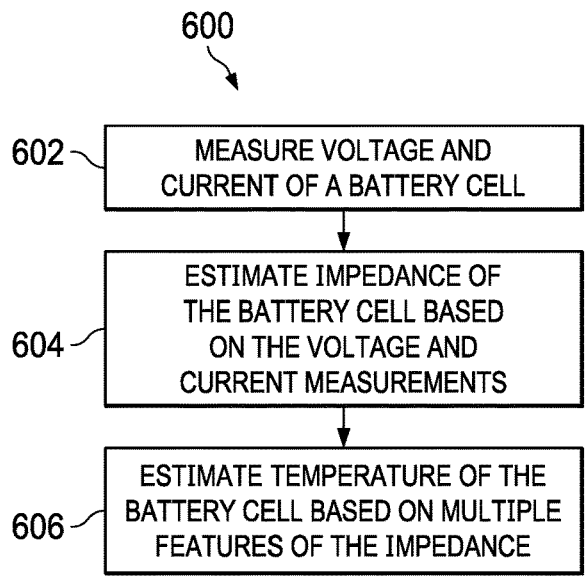
FIG. 6 is a flow diagram for a method of EIS-based temperature estimation using multiple impedance features.

FIG. 6 is a flow diagram for a method 600 of EIS-based temperature estimation using multiple impedance features. Though depicted sequentially as a matter of convenience, at least some of the actions shown can be performed in a different order and/or performed in parallel. Additionally, some implementations may perform only some of the actions shown.

In block 602, the voltage across a battery cell and the current flowing out of the battery cell are measured. The battery cell may include or more battery cells connected in parallel and/or in series. The voltage and current include a frequency component.

In block 604, the impedance of the battery cell is estimated based on the voltage and current measurements of block 602, the frequency component of the voltage and current measurements, and the state of charge of the battery cell. The impedance includes multiple features.

In block 606, the temperature of the battery cell is estimated based on multiple features of the impedance (a feature vector) estimated in block 604. Estimation of the temperature of the battery cell may be in accordance with equation (3).

In this description, the term "couple" or "couples" may cover connections, communications, or signal paths that enable a functional relationship consistent with this description. For example, if device A generates a signal to control device B to perform an action: (a) in a first example, device A is coupled to device B; or (b) in a second example, device A is coupled to device B through intervening component C if intervening component C does not alter the functional relationship between device A and device B, such that device B is controlled by device A via the control signal generated by device A. Also, in this description, the recitation "based on" means "based at least in part on." Therefore, if X is based on Y, then X may be a function of Y and any number of other factors.

Modifications are possible in the described embodiments, and other embodiments are possible, within the scope of the claims.

What is claimed is:

1. An apparatus comprising:
    a temperature circuit configured to set a frequency of voltage modulation or current modulation for a battery cell;
    voltage measurement circuitry coupled to the temperature circuit, the voltage measurement circuit configured to measure a voltage of the battery cell at the frequency to produce a measured voltage; and
    current measurement circuitry coupled to the temperature circuit, the current measurement circuit configured to measure a current of the battery cell at the frequency to produce a measured current; and
    wherein the temperature circuit is further configured to:
        determine an impedance of the battery cell at the frequency based on the measured voltage and the measured current; and
        determine a temperature of the battery cell based on a feature vector including at least two features of the impedance at the frequency, the at least two features comprising a first impedance feature and a second impedance feature, wherein the first impedance feature is an inverse term and the second impedance feature is a non-inverse term.

2. The apparatus of claim 1, wherein the second impedance feature comprises a real part of the impedance, an imaginary part of the impedance, a magnitude of the impedance, or an angle of the impedance.

3. The apparatus of claim 2, wherein the first impedance feature comprises an inverse of the real part of the impedance, an inverse of the imaginary part of the impedance, an inverse of the magnitude of the impedance, or an inverse of the angle of the impedance.

4. The apparatus of claim 1, wherein the temperature circuit is configured to produce estimated temperature values with less than 1% error over a frequency range of 1 millihertz (mHz) to 10 kilohertz (kHz).

5. The apparatus of claim 1, wherein the feature vector includes at least six features of the impedance.

6. The apparatus of claim 1, wherein the temperature circuit is configured to determine the temperature of the battery cell as a linear or non-linear combination of the features of the impedance.

7. A method comprising:
    setting, by a temperature circuit, a frequency of voltage modulation or current modulation for a battery cell;
    determining, by voltage measurement circuitry, a voltage of the battery cell at the frequency to produce a measured voltage;
    determining, by current measurement circuitry, a current of the battery cell at the frequency to produce a measured current;
    determining, by the temperature circuit, an impedance of the battery cell at the frequency based on the measured voltage and the measured current; and
    determining, by the temperature circuit, a temperature of the battery cell based on a feature vector including at least two features of the impedance at the frequency, the at least two features comprising a first impedance feature and a second impedance feature, wherein the first impedance feature is an inverse term and the second impedance feature is a non-inverse term.

8. The method of claim 7, wherein the second impedance feature comprises a real part of the impedance, an imaginary part of the impedance, a magnitude of the impedance, or an angle of the impedance.

9. The method of claim 8, wherein the first impedance feature comprises an inverse of the real part of the impedance, an inverse of the imaginary part of the impedance, an inverse of the magnitude of the impedance, or an inverse of the angle of the impedance.

10. The method of claim 7, wherein the feature vector includes at least six features of the impedance.

11. The method of claim 7, further comprising determining the temperature of the battery cell as a linear or non-linear combination of the features of the impedance.

12. A vehicle system, comprising:
    a battery cell;
    a temperature circuit adapted to be coupled to a load, the temperature circuit configured to instruct a load to modulate a frequency of a voltage or a current for the battery cell;
    voltage measurement circuitry coupled to the temperature circuit, the voltage measurement circuit configured to measure a voltage of the battery cell at the frequency to produce a measured voltage; and
    current measurement circuitry coupled to the temperature circuit, the current measurement circuit configured to measure a current of the battery cell at the frequency to produce a measured current; and
    wherein the temperature circuit is further configured to:
        determine an impedance of the battery cell at the frequency based on the measured voltage and the measured current; and
        determine a temperature of the battery cell based on a feature vector including at least two features of the impedance, the at least two features comprising a first impedance feature and a second impedance feature, wherein the first impedance feature is an inverse term and the second impedance feature is a non-inverse term.

13. The vehicle system of claim 12, wherein the second impedance feature comprises a real part of the impedance, an imaginary part of the impedance, a magnitude of the impedance, or an angle of the impedance.

14. The vehicle system of claim 13, wherein the first impedance feature comprises an inverse of the real part of the impedance, an inverse of the imaginary part of the impedance, an inverse of the magnitude of the impedance, or an inverse of the angle of the impedance.

15. The vehicle system of claim 12 wherein the temperature circuit is configured to produce estimated temperature values with less than 1% error over a frequency range of 1 millihertz (mHz) to 10 kilohertz (kHz).

16. The vehicle system of claim 12, wherein the battery cell includes one or more battery cells.

17. The vehicle system of claim 12, wherein the feature vector includes at least six features of the impedance.

18. The vehicle system of claim 12, wherein the temperature circuit is configured to estimate the temperature of the battery cell as a linear or non-linear combination of the features of the impedance of the battery cell at the frequency.

* * * * *